(12) United States Patent
Lee et al.

(10) Patent No.: US 7,706,195 B2
(45) Date of Patent: Apr. 27, 2010

(54) STROBE SIGNAL CONTROLLING CIRCUIT

(75) Inventors: Kyong Ha Lee, Yongin-si (KR); Jong Won Lee, Gwangmyeong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 126 days.

(21) Appl. No.: 12/150,404

(22) Filed: Apr. 28, 2008

(65) Prior Publication Data
US 2009/0168564 A1   Jul. 2, 2009

(30) Foreign Application Priority Data
Dec. 28, 2007   (KR) .................. 10-2007-0141029

(51) Int. Cl.
  G11C 27/02   (2006.01)
(52) U.S. Cl. .................................. 365/193
(58) Field of Classification Search .................. 365/193
  See application file for complete search history.

(56) References Cited
U.S. PATENT DOCUMENTS
6,115,322 A * 9/2000 Kanda et al. ............ 365/233.14

2007/0058459 A1 * 3/2007 Kitamura .................. 365/193

FOREIGN PATENT DOCUMENTS
| KR | 10-2001-0004194 | 1/2001 |
| KR | 10-2002-0031833 | 5/2002 |
| KR | 10-2004-0102899 | 8/2004 |

* cited by examiner

Primary Examiner—Hoai V Ho
Assistant Examiner—Jay Radke
(74) Attorney, Agent, or Firm—John P. White; Cooper & Dunham LLP

(57) ABSTRACT

A strobe signal controlling circuit is provided which includes an initial write controller configured to outputs a write pulse signal, which is activated in a write command, in synchronization with a clock signal, a DQS signal outputting unit configured to outputs a write DQS signal by synchronizing an output signal of the initial write controller to the clock signal, a control signal generator configured to generates a control signal in response to the output signal of the initial write controller, and a reset signal generator configured to responds to a reset signal and a DQS enable signal to output a reset signal to the DQS signal outputting module in synchronization with the control signal.

22 Claims, 10 Drawing Sheets

STROBE SIGNAL CONTROLLING CIRCUIT

BACKGROUND

The present disclosure relates to a semiconductor memory device, and more particularly to a strobe signal controlling circuit.

Generally, a semiconductor memory device employs a strobe signal DQS by using a short pulse signal used to synchronize with an external chip set in order to transmit data during the transmission or the reception of data.

FIG. 1 is a block diagram showing a conventional strobe signal controlling circuit.

As shown in FIG. 1, according to the conventional strobe signal controlling circuit, an initial write controller generates a signal WT0 after receiving a pulse signal WTP generated by decoding a write command and synchronizing the pulse signal WTP to a clock signal CLK, so that signals WT1 to WT8 are generated through a DQS signal outputting unit. The signals may be selected according to burst lengths. The signals are selected according to the burst lengths BL in a DQS selection unit so that a signal DQS_OFF_CTRL is output. A reset signal generator outputs a reset signal to reset the output of each shift register provided in the DQS signal outputting unit.

FIG. 2 is a circuit diagram of the initial write controller shown in FIG. 1. If the signal WTP is applied to the initial write controller, the signal WT0 is enabled and then not disabled until a next high-level clock pulse is applied.

FIG. 3 is a circuit diagram of the reset signal generator shown in FIG. 1. When receiving the signal WTP, that is, receiving a new write command, the reset signal generator resets the DQS signal outputting unit. In addition, even when receiving a signal RST, which is generated upon MRS or power-up, the reset signal generator performs a reset operation. In a read operation, the reset signal generator performs the reset operation.

FIGS. 4 and 5 are operational timing charts of the strobe signal controlling circuit shown in FIG. 1. FIG. 4 illustrates the operation of the strobe signal controlling circuit in an ideal case, in which a write command corresponding to "BL=8" is consecutively applied twice. When the write command is input at a t1 clock pulse, the signal WTP is generated, and the signal WTP is inverted to generate a signal RSTB. The initial write controller generates the signal WT0 corresponding to one period of the clock signal. In addition, signals WT1 to WT4, which are sequentially shifted from the signal WT0 by one clock, are generated. Finally, the signal DQS_OFF_CTRL is generated. In this case, although the signal WT4 must be generated at a t5 clock pulse, the signal WT4 is not generated because the DQS signal generator is reset by the signal RSTB. Similarly, even in the second write operation, the signal WT0 is shifted by one period of the clock signal such that the signals WT1 to WT4 are generated. In this case, since the next write command does not exist, the signal WT4 is normally generated. Thereafter, the signal DQS_OFF_CTRL signal is generated to control the following DQS signal.

FIG. 5 illustrates a case in which the signal WTP is applied prior to the signal CLK. The signal RSTB is generated in the same time point as that of the signal WTP. The signal WT0 is generated at the same time point as the enable time point of the signal WTP. In this case, when the signal WT0 is shifted to a shift register, the signal RSTB becomes a high level before the clock signal becomes a low level. In other words, since the clock signal is in the low level when the signal WT0 is shifted to the shift register, the signal WT0 is not shifted by ½ CLK, but signals prolonged by ½ CLK are generated.

Accordingly, the signal WT1 is enabled from a time point, at which the low level of the signal RSTB is changed into the high level, to a next enable time point of the clock signal while maintaining a high level. Such signals are consecutively delivered through shift registers, and the signal WT4 exists in remaining duration except for a portion of a next write signal WTP, differently from that shown in FIG. 4. The signal WT4 becomes the signal DQS_OFF_CTRL as it is, to prevent the last falling DQS in the first write operation and a falling DQS in the second write operation from being generated, so that a write fail occurs.

BRIEF SUMMARY

In an aspect of the present disclosure, a strobe signal controlling circuit is provided which is capable of normally controlling a signal DQS even if a write pulse signal is generated prior to a clock signal when a write command is input.

In one embodiment, a strobe signal controlling circuit includes a control signal generator configured to generate a control signal for controlling a write DQS signal in response to a initial write pulse signal in synchronization with a clock signal.

In another embodiment, a strobe signal controlling circuit includes an initial write controller configured to output a write pulse signal, which is activated in a write command, in synchronization with a clock signal, a DQS signal outputting unit configured to output a write DQS signal by synchronizing an output signal of the initial write controller to the clock signal, a control signal generator configured to generate a control signal in response to the output signal of the initial write controller, and a reset signal generator configured to respond to a reset signal and a DQS enable signal to output a reset signal to the DQS signal outputting module in synchronization with the control signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Hereinafter, examples and exemplary embodiments of the present invention will be described with reference to accompanying drawings.

Figure 1:
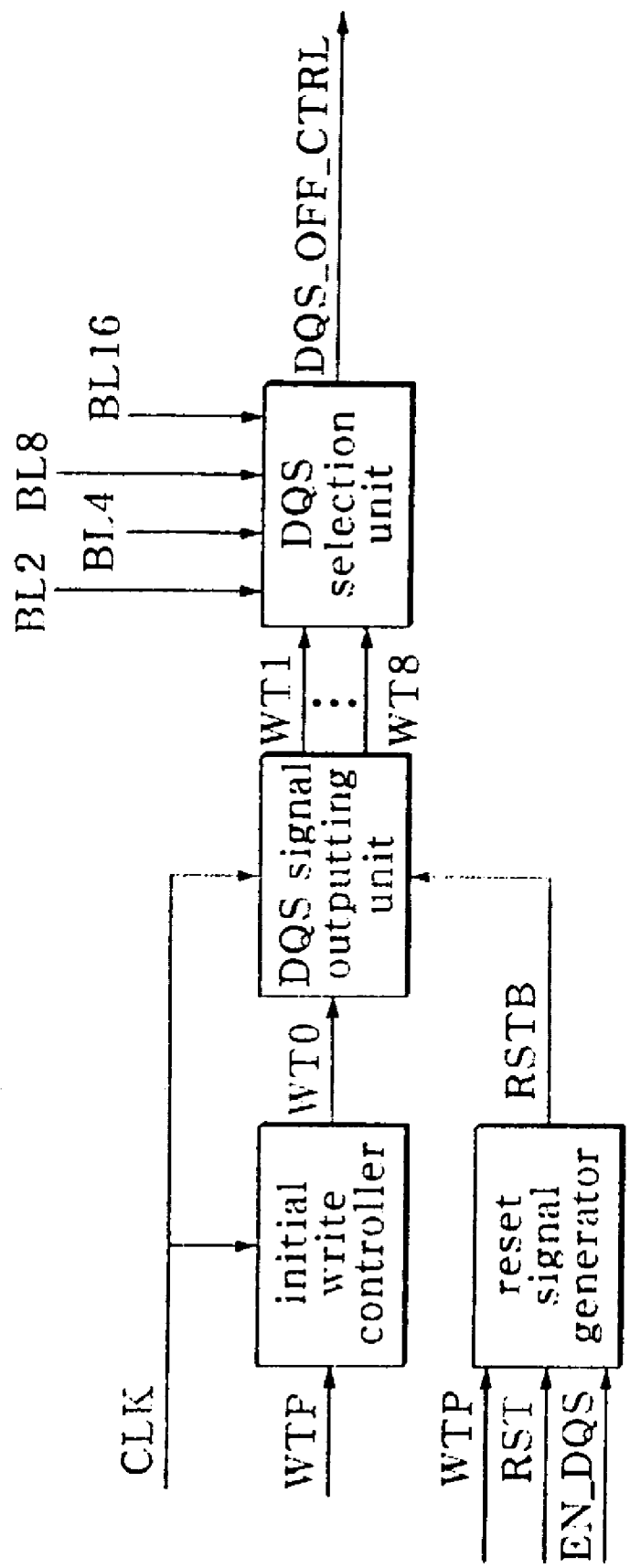
FIG. 1 is a block diagram showing a conventional strobe signal controlling circuit.
Figure 2:
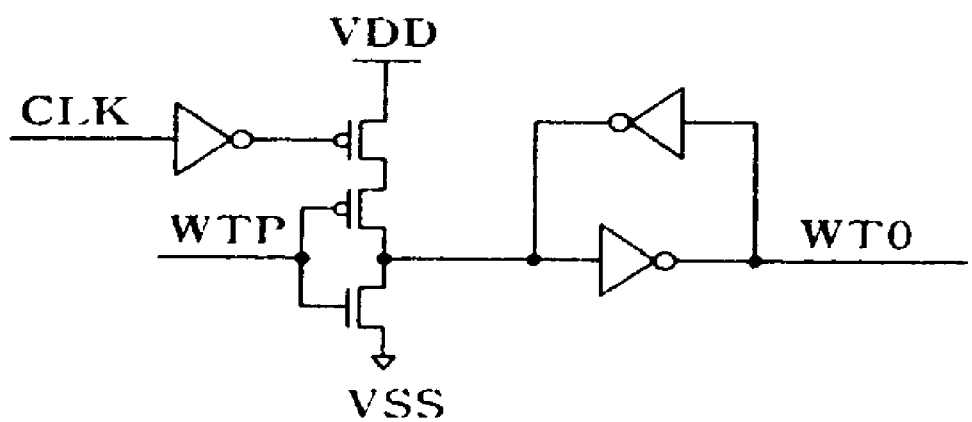
FIG. 2 is a circuit diagram of an initial write controller of FIG. 1.
Figure 3:
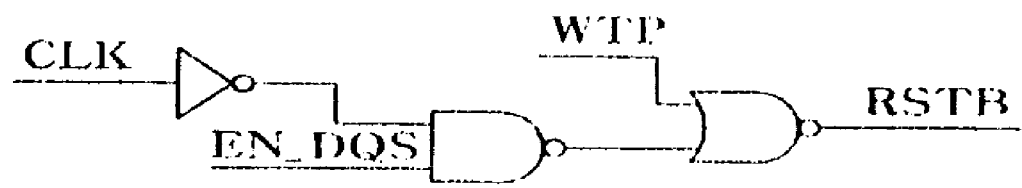
FIG. 3 is a circuit diagram of a reset signal generator of FIG. 1.
Figure 4:
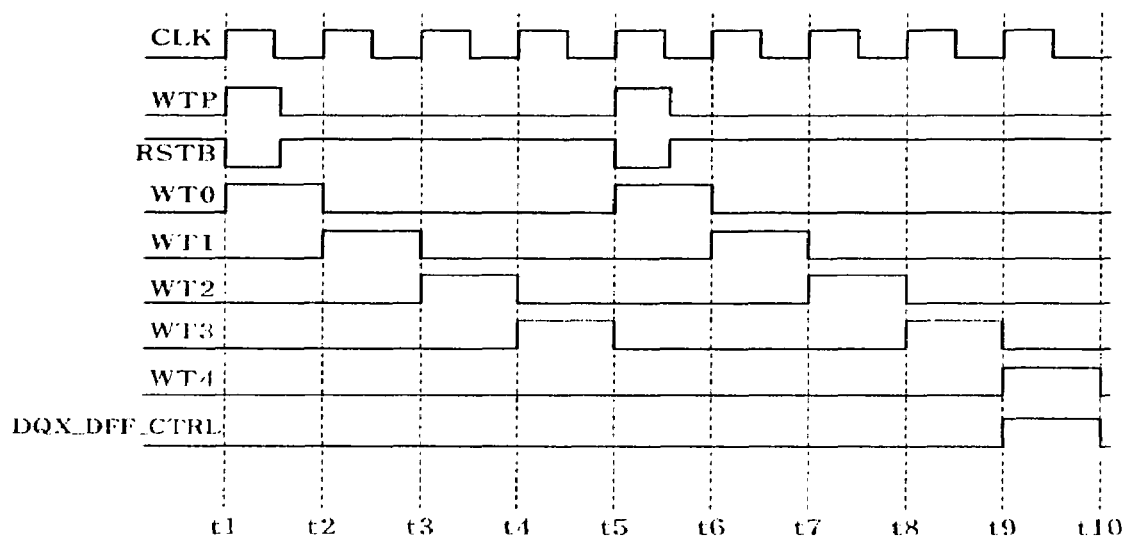
FIGS. 4 and 5 are operational timing charts of the strobe signal controlling circuit shown in FIG. 1.
Figure 5:
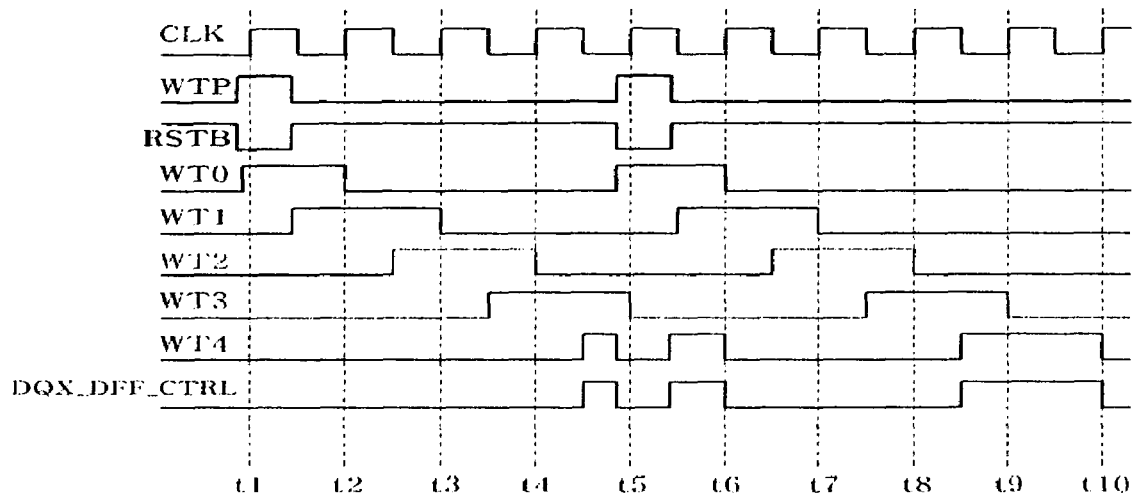
Figure 6:
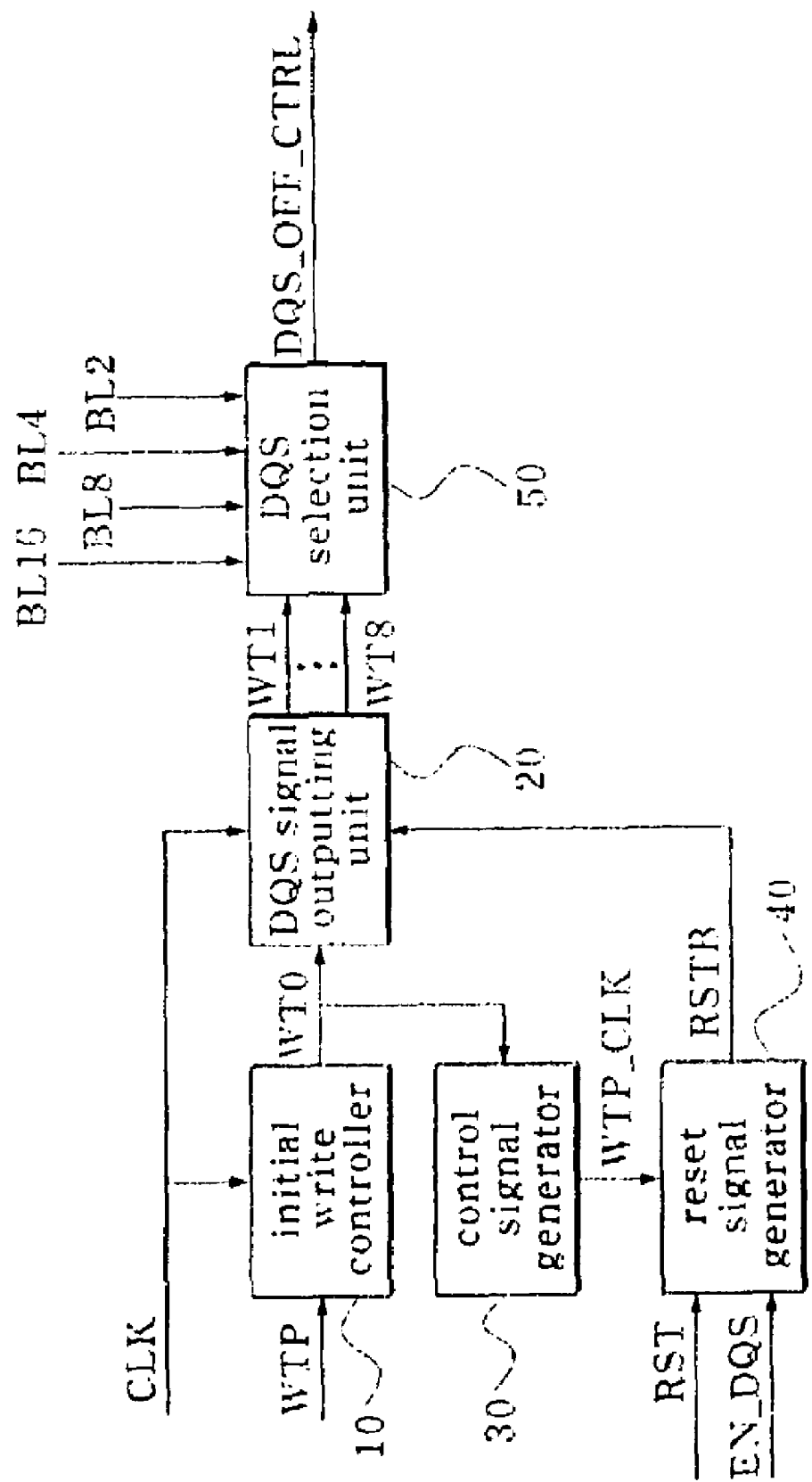
FIG. 6 is a block diagram showing a strobe signal controlling circuit according to an exemplary embodiment of the present disclosure.

FIG. 6 is a block diagram showing a strobe signal controlling circuit according to an exemplary embodiment of the present disclosure.

In the exemplary embodiment shown in FIG. 6, the strobe signal controlling circuit includes an initial write controller 10, a DQS signal outputting unit 20, a control signal generator 30, and a reset signal generator 40. The initial write controller 10 inputs a write pulse signal WTP, which is activated in a write command, in synchronization with a clock signal CLK. The DQS signal outputting unit 20 outputs write DQS signals WT1 to WT8 by synchronizing an output signal WT0 of the initial write controller 10 to the clock signal CLK. The control signal generator 30 generates a control signal WTP_CLK in response to the output signal WT0 of the initial write controller 10. The reset signal generator 40 responds to a reset signal RST and a DQS enable signal EN_DQS to output a reset signal RSTB to the DQS signal outputting unit 20 in synchronization with the control signal WTP_CLK.

Figure 7:
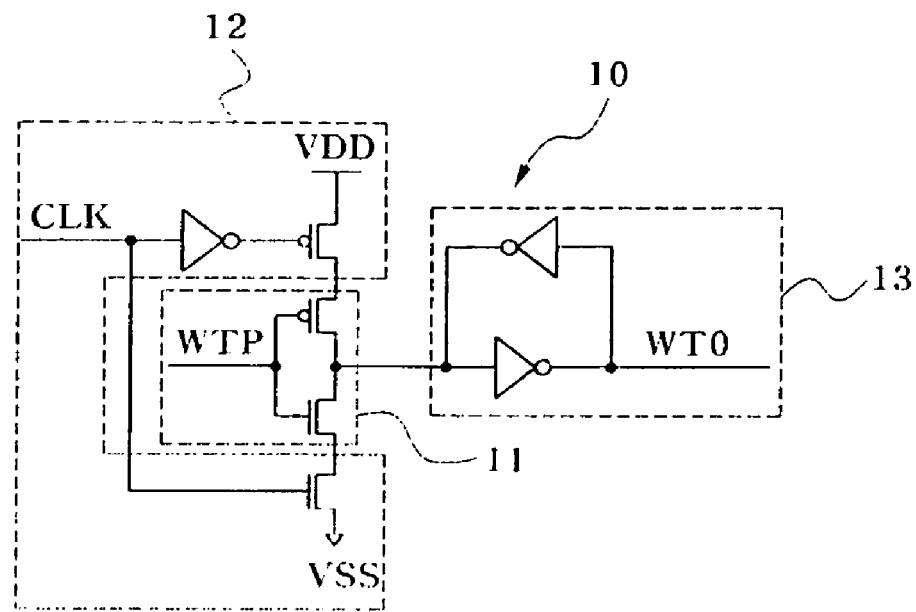
FIG. 7 is a circuit diagram of an initial write controller shown in FIG. 6.

FIG. 7 is a circuit diagram of the initial write controller 10 shown in FIG. 6.

As shown in FIG. 7, the initial write controller 10 includes a driver 11, which is driven in response to the write pulse signal WTP, and a clock synchronization unit 12, which responds to the clock signal CLK to output an output signal of the driver 11 in synchronization with the clock signal.

The driver 11 includes a pull-up driver, which is pull-up driven in response to the write pulse signal WTP, and a pull-down driver, which is pull-down driven in response to the write pulse signal WTP.

The clock synchronization unit 12 includes a pull-up driver, which is pull-up driven in response to the inverse signal of the clock signal CLK, and a pull-down driver, which is pull-down driven in response to the clock signal CLK.

The initial write controller 10 further includes a latch unit 13 for latching the output signal of the driver 11.

Figure 8:
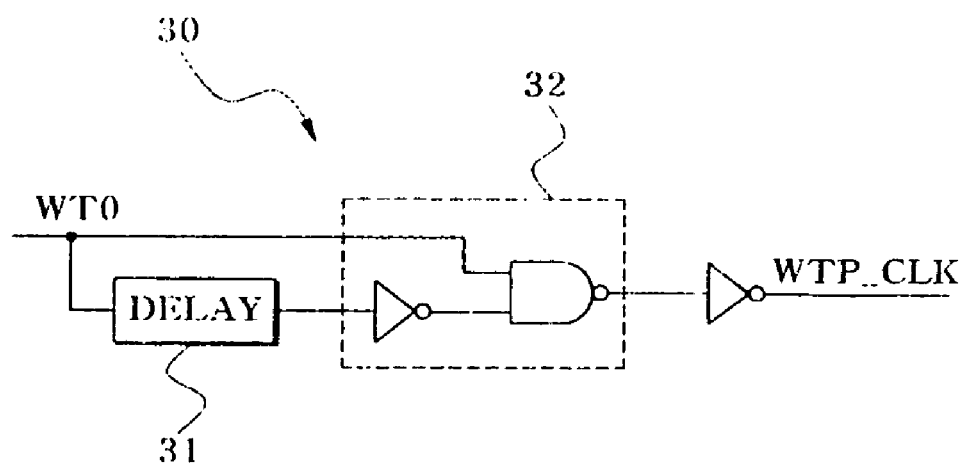
FIG. 8 is a circuit diagram of a control signal generator shown in FIG. 6.

FIG. 8 is a circuit diagram of the control signal generator 30 shown in FIG. 6.

As shown in FIG. 8, the control signal generator 30 includes a delay unit 31, which delays the output signal WT0 of the initial write controller 10 by predetermined time and then outputs the output signal WT0, and an operation unit 32, which performs a logical operation with respect to the output signal of the initial write controller 10 and the output signal of the delay unit 31.

Figure 9:
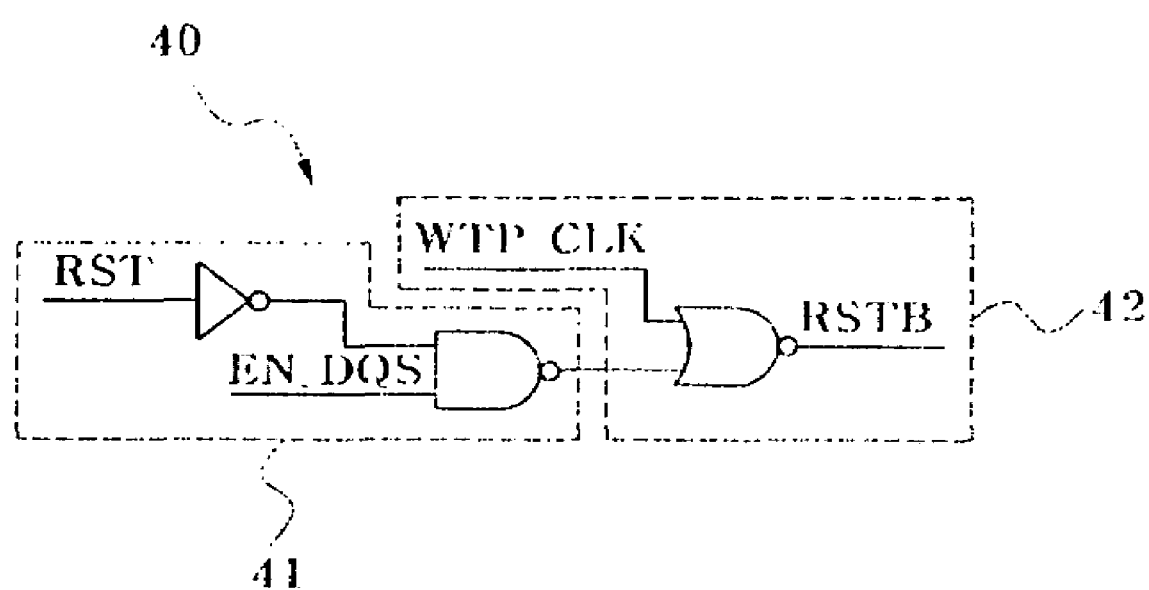
FIG. 9 is a circuit diagram of a reset signal generator shown in FIG. 6.

FIG. 9 is a circuit diagram of the reset signal generator 40 shown in FIG. 6.

As shown in FIG. 9, the reset signal generator 40 includes a first operation unit 41, which performs a logical operation in response to the reset signal RST and the DQS enable signal EN_DQS, and a second operation unit 42, which performs a logical operation in response to the output signal of the first operation unit 41 and the control signal WTP_CLK.

Figure 10A:
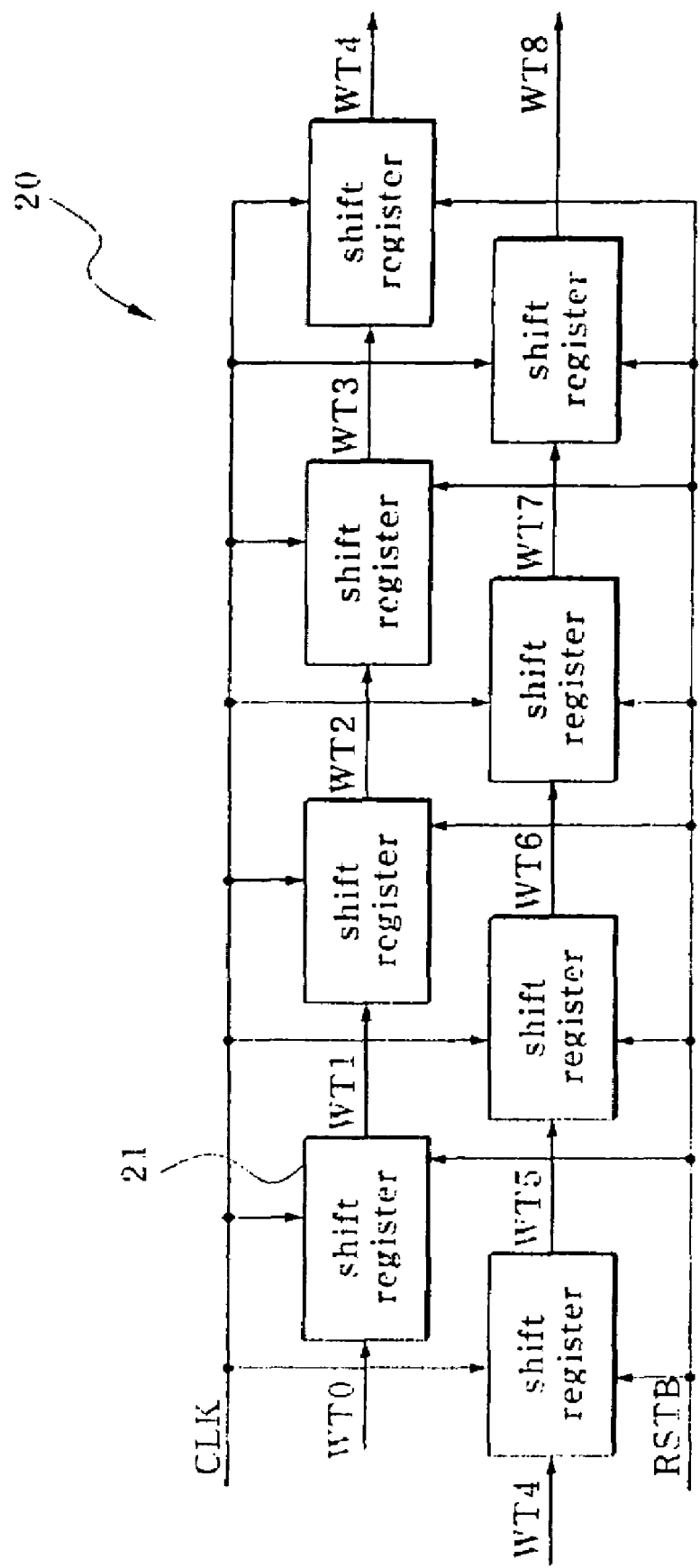
FIGS. 10a and 10b are circuit diagrams of a DQS signal outputting unit shown in FIG. 6.
Figure 10B:
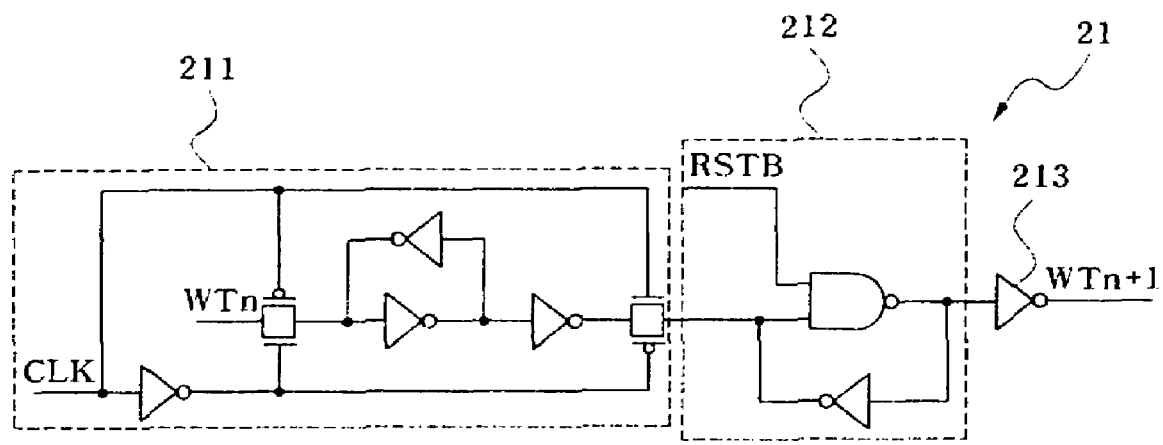

FIGS. 10a and 10b are circuit diagrams of the DQS signal outputting unit 20 shown in FIG. 6.

As shown in FIG. 10a, the DQS signal outputting unit 20 includes a plurality of shift registers 21 which output input write DQS signals WTn in synchronization with the clock signal CLK, and are reset in response to the reset signal RSTB.

As shown in FIG. 10b, the shift register 21 includes a DQS signal synchronization unit 211, an operation unit 212, and a buffer unit 213. The DQS signal synchronization unit 211 outputs the write DQS signal WTn in synchronization with the clock signal CLK. The operation unit 212 performs a logical operation in response to the output signal of the DQS signal synchronization unit 211 and the reset signal RSTB. The buffer unit 213 buffers the output signal of the operation unit 22.

Figure 11:
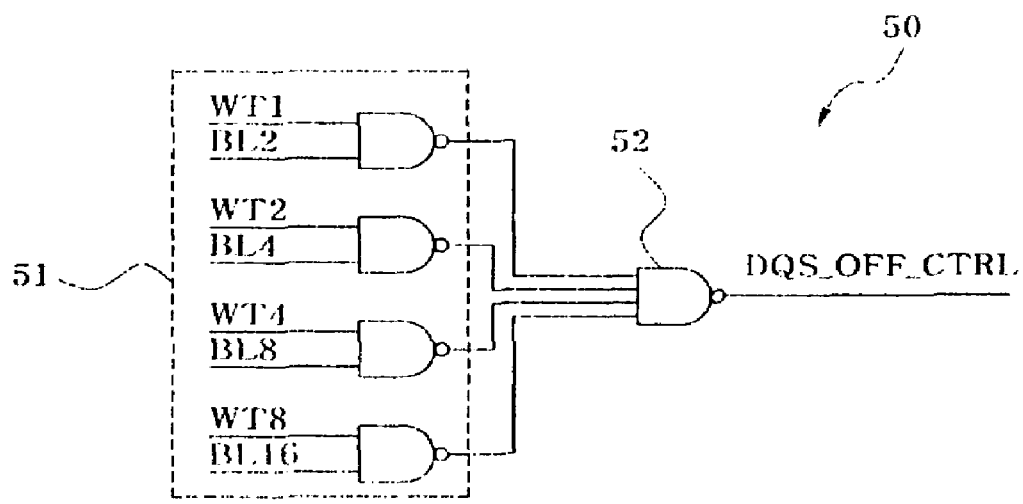
FIG. 11 is a circuit diagram of a DQS selection unit shown in FIG. 6.

FIG. 11 is a circuit diagram of a DQS selection unit 50 shown in FIG. 6.

In the exemplary embodiment shown in FIGS. 6 and 11, the DQS selection unit 50 responds to the output signals WT1 to WT8 of the DQS signal outputting unit 20 and burst length signals BL2, BL4, BL8, and BL16 to output a DQS off control signal DQS_OFF_CTRL.

As shown in FIG. 11, the DQS selection unit 50 includes first to fourth operation units 51, which perform logical operations in response to the write DQS signals and the burst length signals, and a fifth operation unit 52, which performs a logical operation with respect to the output signals of the first to fourth operation units 51.

Figure 12:
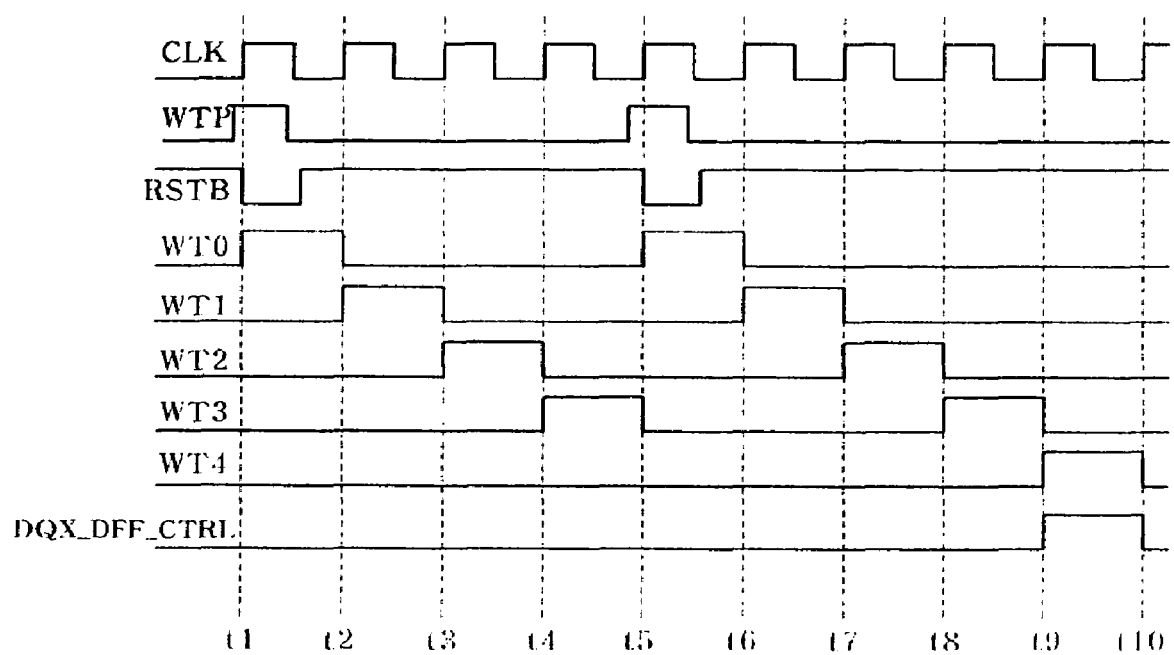
FIG. 12 is an operational timing chart of a strobe signal controlling circuit of FIG. 6.

Hereinafter, the operational procedure according to an exemplary embodiment of the present disclosure having the above structure will be described with reference to FIGS. 6 to 12. FIG. 12 is an operational timing chart of the strobe signal controlling circuit of FIG. 6.

As shown in FIGS. 6 and 7, the initial write controller 10 according to the exemplary embodiment of the present invention outputs the write pulse signal WTP, which is activated in a write command, in synchronization with the clock signal CLK. Even if the write pulse signal WTP is input prior to the clock signal CLK, the pull-up driver and the pull-down driver are synchronized to the clock signal CLK such that the write pulse signal WTP always follows the clock signal CLK.

As shown in FIG. 8, the control signal generator 30 outputs the control signal WTP_CLK in response to the output signal WT0 of the initial write controller 10. In this case, the output signal WT0 is delayed such that the output signal WT0 has a predetermined pulse width. This is necessary to prevent the strobe signal controlling circuit from erroneously operating due to a narrow pulse width when the write pulse signal WTP is applied after the clock signal CLK. In addition, the output signal WT0 synchronized to the clock signal CLK passes through at least two inverter stages, such that the output signal WT0 is naturally applied after the clock signal CLK.

As shown in FIG. 9, the reset signal generator 40 responds to the reset signal RST and the DQS enable signal EN_DQS to output the reset signal RSTB to the DQS signal outputting unit 20 in synchronization with the control signal WTP_CLK. In other words, the control signal WTP_CLK is applied to a unit for generating the reset signal RSTB, such that the reset signal RSTB is always generated after the clock signal CLK. Accordingly, it is possible to solve a problem that a write DQS signal is shifted only by ½ period of the clock signal in the first shift register.

As described above, according to the present invention, even if the write pulse signal is generated prior to the clock signal upon the write command, the DQS signal can be normally controlled.

Although examples and preferred embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application number 10-2007-0141029, filed on Dec. 28, 2007, the entire contents of which are incorporated herein by reference.

What is claimed is:

1. A strobe signal controlling circuit comprising:
   a control signal generator configured to generate a control signal for controlling a write DOS signal in response to a initial write pulse signal in synchronization with a clock signal; and
   a reset signal generator configured to output a reset signal to a DOS signal outputting unit in synchronization with the control signal.

2. The strobe signal controlling circuit of claim 1, wherein the control signal generator includes:
   a delay unit configured to delay the initial write pulse signal; and
   an operation unit configured to perform a logical operation with respect to the initial write pulse signal and an output signal of the delay unit.

3. The strobe signal controlling circuit of claim 1, further including an initial write controller configured to output the initial write pulse signal, which is activated in a write command, in synchronization with a clock signal.

4. The strobe signal controlling circuit of claim 3, wherein the initial write controller includes:
   a driver configured to be driven in response to the write pulse signal; and
   a clock synchronization unit configured to respond to the clock signal to output an output signal of the driver in synchronization with the clock signal.

5. The strobe signal controlling circuit of claim 4, wherein the driver includes:
   a pull-up driver configured to be pull-up driven in response to the write pulse signal; and
   a pull-down driver configured to be pull-down driven in response to the write pulse signal.

6. The strobe signal controlling circuit of claim 4, wherein the clock synchronization unit includes:
   a pull-up driver configured to be pull-up driven in response to an inverse signal of the clock signal; and
   a pull-down driver configured to be pull-down driven in response to the clock signal.

7. The strobe signal controlling circuit of claim 4, wherein the initial write controller further includes a latch unit configured to latch the output signal of the driver.

8. The strobe signal controlling circuit of claim 1, wherein the reset signal generator includes:
   a first operation unit configured to perform a logical operation in response to a reset signal and a DQS enable signal; and
   a second operation unit configured to perform a logical operation in response to an output signal of the first operation unit and the control signal.

9. The strobe signal controlling circuit of claim 1, wherein the DQS signal outputting unit includes a plurality of shift registers configured to output the write DQS signals in synchronization with the clock signal, and are reset in response to the reset signal.

10. The strobe signal controlling circuit of claim 9, wherein the shift register includes:
    a DQS signal synchronization unit configured to output the write DQS signal in synchronization with the clock signal; and
    an operation unit configured to perform a logical operation in response to an output signal of the DQS signal synchronization unit and the reset signal.

11. A strobe signal controlling circuit comprising:
    an initial write controller configured to output a write pulse signal, which is activated in a write command, in synchronization with a clock signal;
    a DQS signal outputting unit configured to output a write DQS signal by synchronizing an output signal of the initial write controller to the clock signal;
    a control signal generator configured to generate a control signal in response to the output signal of the initial write controller; and
    a reset signal generator configured to respond to a reset signal and a DQS enable signal to output a reset signal to the DQS signal outputting module in synchronization with the control signal.

12. The strobe signal controlling circuit of claim 11, wherein the initial write controller includes:
    a driver configured to be driven in response to the write pulse signal; and
    a clock synchronization unit configured to respond to the clock signal to output an output signal of the driver in synchronization with the clock signal.

13. The strobe signal controlling circuit of claim 12, wherein the driver includes:
    a pull-up driver configured to be pull-up driven in response to the write pulse signal; and
    a pull-down driver configured to be pull-down driven in response to the write pulse signal.

14. The strobe signal controlling circuit of claim 12, wherein the clock synchronization unit includes:
    a pull-up driver configured to be pull-up driven in response to an inverse signal of the clock signal; and
    a pull-down driver configured to be pull-down driven in response to the clock signal.

15. The strobe signal controlling circuit of claim 12, wherein the initial write controller further includes a latch unit configured to latch the output signal of the driver.

16. The strobe signal controlling circuit of claim 11, wherein the DQS signal outputting unit includes a plurality of shift registers configured to output input write DQS signals in synchronization with the clock signal, and are reset in response to the reset signal.

17. The strobe signal controlling circuit of claim 16, wherein the shift register includes:
    a DQS signal synchronization unit configured to output the write DQS signal in synchronization with the clock signal; and
    an operation unit configured to perform a logical operation in response to an output signal of the DQS signal synchronization unit and the reset signal.

18. The strobe signal controlling circuit of claim 17, wherein the shift register further includes a buffer unit configured to buffer an output signal of the operation unit.

19. The strobe signal controlling circuit of claim 11, wherein the control signal generator includes:
    a delay unit configured to delay and then outputs the output signal of the initial write controller; and
    an operation unit configured to perform a logical operation with respect to the output signal of the initial write controller and an output signal of the delay unit.

20. The strobe signal controlling circuit of claim 11, wherein the reset signal generator includes:
    a first operation unit configured to perform a logical operation in response to the reset signal and the DQS enable signal; and a second operation unit configured to perform a logical operation in response to an output signal of the first operation unit and the control signal.

21. The strobe signal controlling circuit of claim 11, further including a DQS selection unit configured to output a DQS off control signal in response to write DQS signals and burst length signals.

22. The strobe signal controlling circuit of claim 21, wherein the DQS selection unit includes:

first to fourth operation units configured to perform logical operations in response to the write DQS signals and the burst length signals; and a fifth operation unit configured to perform a logical operation with respect to output signals of the first to fourth operation units.

* * * * *